(12) United States Patent
Kobayashi

(10) Patent No.: US 7,639,344 B2
(45) Date of Patent: Dec. 29, 2009

(54) EXPOSURE APPARATUS AND METHOD OF MANUFACTURING DEVICE

(75) Inventor: Fumitake Kobayashi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/185,272

(22) Filed: Aug. 4, 2008

(65) Prior Publication Data

US 2009/0040499 A1 Feb. 12, 2009

(30) Foreign Application Priority Data

Aug. 7, 2007 (JP) ............... 2007-205848

(51) Int. Cl.
*G03B 27/58* (2006.01)
*G03B 27/62* (2006.01)

(52) U.S. Cl. ........................... 355/72; 355/75
(58) Field of Classification Search ............. 355/53, 355/72–76; 310/10, 12; 318/649; 378/34, 378/35

See application file for complete search history.

(56) References Cited

U.S. PATENT DOCUMENTS 5,040,431 A    8/1991  Sakino et al.
5,661,388 A *  8/1997  Kurosawa ............. 318/625
6,566,770 B1 * 5/2003  Nakamura ............ 307/154

FOREIGN PATENT DOCUMENTS

| JP | 07-191757 A |   | 7/1995 |
| JP | 407191757   | * | 7/1995 |
| JP | 07-328966 A |   | 12/1995 |
| JP | 2001-060614 A |  | 3/2001 |

OTHER PUBLICATIONS

European Search Report issued on Nov. 12, 2008 for European Patent Application No. EP 08162028.

* cited by examiner

*Primary Examiner*—Hung Henry Nguyen
(74) *Attorney, Agent, or Firm*—Rossi, Kimms & McDowell LLP

(57) ABSTRACT

This invention provides a positioning apparatus which can safely stop a movable body irrespective of its driving status. This invention relates to a positioning apparatus which positions a movable body (4) of an exposure apparatus and includes a driver (2) which drives the movable body (4), a power source (3) which supplies power to the driver (2), and a controller (1). The controller (1) stops the power supply from the power source (3) to the driver (2) after the elapse of a time period, which is determined in accordance with the driving status of the movable body (4) driven by the driver (2), in response to a stop instruction signal (11) which instructs to stop the driving of the movable body (4).

12 Claims, 3 Drawing Sheets ns and an apparatus power shutdown request is enabled, and the power source of the apparatus main body is stopped. After the power supply from the power source to the linear motor is stopped, the regenerative brake is activated to stop the linear motor. In this case, the linear motor may damage upon colliding against, for example, its mechanical stopper depending on the position, moving velocity, and moving direction of the stage. In particular, since a stage with high inertia is operated at high speed along with increases in the size and complexity of the exposure apparatus, the risk of such damage is increasing.

The exposure apparatus disclosed in Japanese Patent Laid-Open No. 2001-60614 uses a time lag of, for example, several hundreds of milliseconds between the activation of the brake mechanism and that of the power shutdown device. The stage may travel at high speed in activating the brake mechanism, and it may still travel at high speed even in activating the power shutdown device. To avoid this situation, the stage can be urgently decelerated within a predetermined time lag by changing the brake condition of the brake mechanism. However, the urgent deceleration may impose a heavy load on the stage, resulting in its deformation.

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

A process of manufacturing a semiconductor device includes a lithography step of transferring by exposure a circuit pattern formed on an original onto a substrate. In the lithography step, the original and substrate are fixed on an original stage and substrate stage, respectively, and these stages are driven in synchrony by linear motors, thereby performing exposure. Recently, in order to improve the productivity and operating ratio of such an exposure apparatus, its size and operating speed have been increased. Along with such increases in the size and speed of the exposure apparatus, a safety measure for its built-in stages is becoming complex.

In the conventional exposure apparatus, an apparatus power source is disconnected as soon as a power shutdown signal is transmitted when a power shutdown switch or emergency stop switch is turned on. To stop a traveling stage in the exposure apparatus, a linear motor used to drive the stage is stopped by, for example, a regenerative brake.

Japanese Patent Laid-Open No. 2001-60614 discloses an exposure apparatus having an emergency stop switch of a two-step structure formed by a first-step switch for activating a brake mechanism, and a second-step switch for activating a power shutdown device. In the exposure apparatus disclosed in Japanese Patent Laid-Open No. 2001-60614, when the emergency stop switch is turned on, the power shutdown device stops power supplied from a power source to a power driving system and the brake mechanism. The emergency stop switch has a two-step structure formed by the first-step switch for activating the brake mechanism, and the second-step for activating the power shutdown device, so that these two switches are activated with a predetermined time lag sufficient to stop traveling of a stage. First, the brake mechanism performs brake control of the power driving system as the first-step switch is activated. The second-step switch is activated a predetermined time after the activation of the first-step switch so that the power shutdown device stops power supplied from the power source to the power driving system and brake mechanism. Therefore, the power supply to the power driving system is stopped after traveling of the stage is stopped.

In the prior art, as soon as the power shutdown switch or emergency stop switch is turned on, an apparatus power shutdown request is enabled, and the power source of the apparatus main body is stopped. After the power supply from the power source to the linear motor is stopped, the regenerative brake is activated to stop the linear motor. In this case, the linear motor may damage upon colliding against, for example, its mechanical stopper depending on the position, moving velocity, and moving direction of the stage. In particular, since a stage with high inertia is operated at high speed along with increases in the size and complexity of the exposure apparatus, the risk of such damage is increasing.

SUMMARY OF THE INVENTION

It is an object of the present invention to provide an exposure apparatus which can safely stop a movable body irrespective of its driving status.

According to the present invention, there is provided an exposure apparatus for projecting a pattern image of an original onto a substrate, the exposure apparatus comprising a projection optical system, positioning apparatus operable to position a movable body, including at least one of: an original stage configured to hold an original; and a substrate stage configured to hold a substrate, the positioning apparatus comprising: a driver configured to drive the movable body; a power source configured to supply power to the driver; and a controller configured to stop the power supply from the power source to the driver after a time period elapses in response to a received stop instruction signal to stop the driving of the movable body, is the time period being determined in accordance with a driving status of the movable body driven by the driver.

According to the present invention, it is possible to provide an exposure apparatus which can safely stop a movable body irrespective of its driving status.

Further features of the present invention will become apparent from the following description of exemplary embodiments with reference to the attached drawings.

DESCRIPTION OF THE EMBODIMENTS

Figure 1:
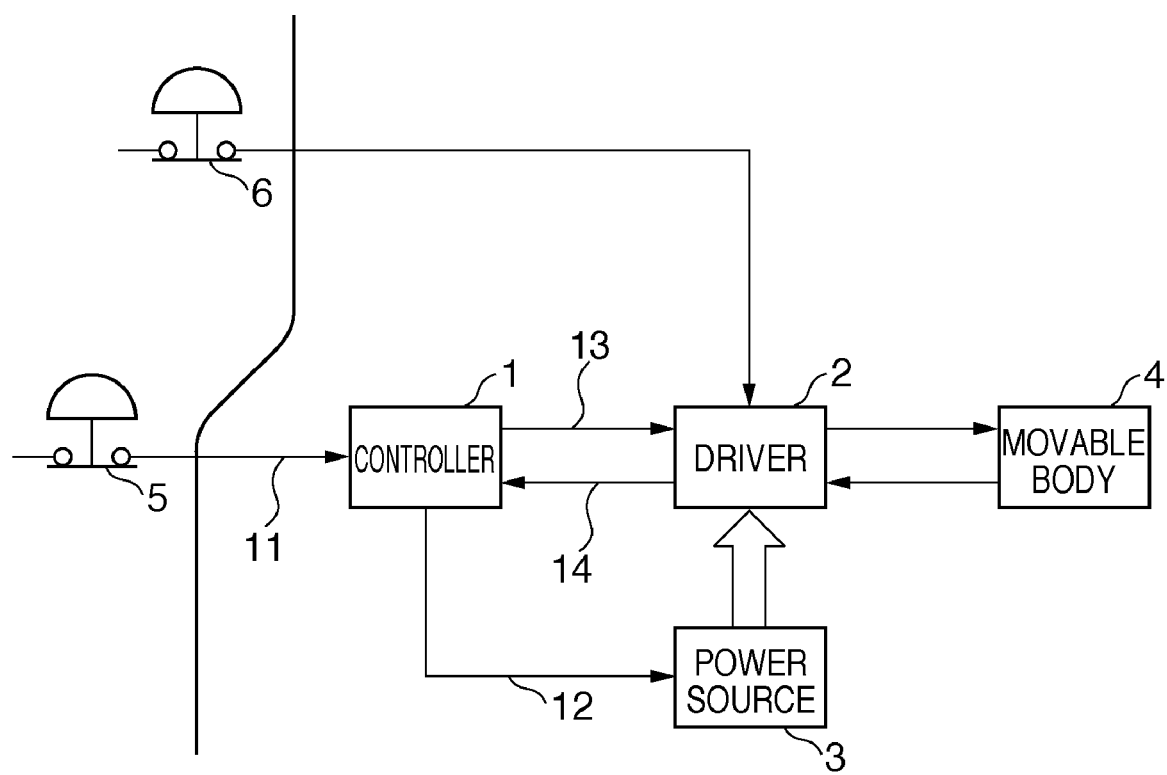
FIG. 1 is a block diagram showing an example of the schematic arrangement of a positioning apparatus according to the present invention.
Figure 2:
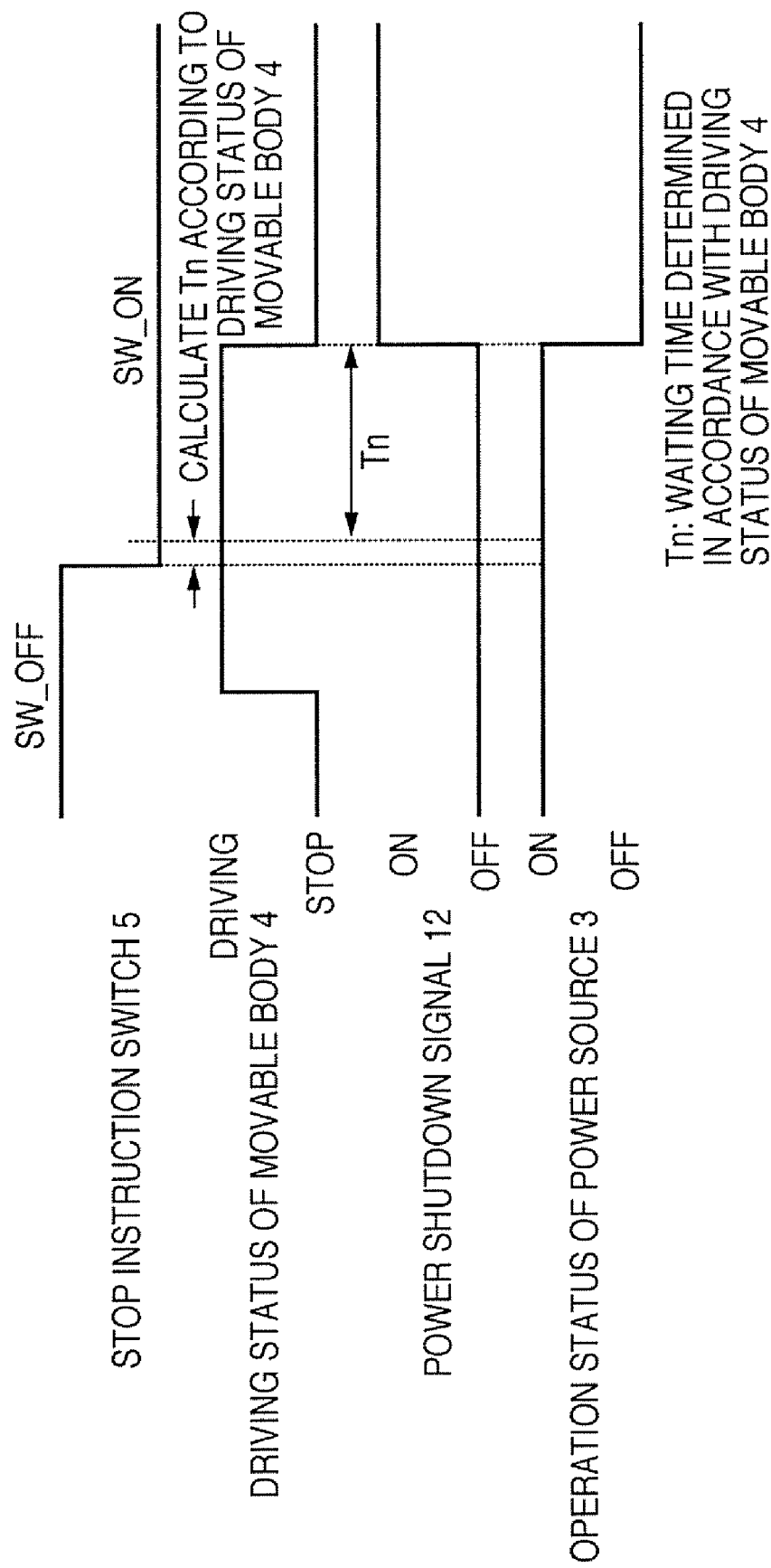
FIG. 2 is a chart showing the timing relationship between the operation statuses of a stop instruction switch, a power source, and a movable body.

FIG. 1 is a block diagram showing an example of the schematic arrangement of a positioning apparatus which positions a movable body according to the present invention. The positioning apparatus includes a driver 2 which drives a movable body 4, a power source 3 which supplies power to the driver 2, and a controller 1 which stops the power supply from the power source 3 to the driver 2. The controller 1 stops the power supply from the power source 3 to the driver 2 in response to a stop instruction signal 11 which gives the instruction to stop the driving of the movable body 4. The movable body 4 can be an original stage 102 which holds an original such as a reticle, or a substrate stage 104 which holds a substrate in an exposure apparatus. The stop instruction signal 11 can be transmitted when, for example, a power shutdown switch or emergency stop switch is manipulated. The power shutdown switch and emergency stop switch will be collectively referred to as a stop instruction switch 5 which gives the instruction to stop the driving of the movable body. FIG. 2 is a chart showing a power shutdown signal 12 and the operation statuses of the movable body 4 and power source 3 when the stop instruction switch 5 is pressed.

In the exposure apparatus, power is supplied from the power source 3 to the driver 2 which drives the movable body 4. In driving the movable body 4, the driver 2 controls, for example, the position and velocity of the movable body 4. The driver 2 herein includes a linear motor, a driver, a driver power source, and a brake mechanism such as a dynamic brake, which drive the movable body 4.

In the exposure apparatus, when the stop instruction switch 5 is turned on, the stop instruction signal 11 which instructs the controller to stop the driving of the movable body is output to the controller 1, and a system reset signal 13 is output to the driver 2. Note that the power shutdown signal 12 output from the controller 1 to the power source 3 is not enabled immediately after the stop instruction switch 5 is turned on.

The stop instruction signal 11 is transmitted as the stop instruction switch 5 is turned on, and when it is received by the controller, the controller 1 calculates and determines a waiting time Tn in accordance with the driving status of the movable body 4 when the stop instruction switch 5 is pressed, based on a driving status signal 14 which controls the driving status of the movable body 4. The waiting time Tn is the time from when the controller 1 determines the waiting time Tn until it stops the power supply from the power source 3 to the driver 2.

After the waiting time Tn has elapsed, the power shutdown signal 12 output to the power source 3 is enabled. A sensor detects at least one piece of information of the position, velocity, and acceleration of the movable body 4. The waiting time Tn is determined based on the information detected by the sensor. The waiting time Tn can be, for example, the time required to decelerate the movable body 4 to a predetermined velocity at which, for example, a dynamic brake can safely stop the movable body 4. Japanese Patent Laid-Open No. 2001-60614 is known as a patent reference which uses a dynamic brake.

Even after the stop instruction switch 5 is turned on, the power source 3 continues supplying power to the driver 2 during the waiting time Tn so that the driver 2 performs brake control of the movable body 4. When the movable body 4 reaches the predetermined velocity or less after the waiting time Tn has elapsed, the power supply from the power source 3 to the driver 2 is stopped in response to the power shutdown signal 12 output from the controller 1.

When the power supply from the power source 3 to the driver 2 is stopped as the power source 3 is turned off, the dynamic brake acts on the driver 2. Then, the movable body 4 moving at the predetermined velocity or less stops without colliding against, for example, its mechanical stopper.

When a reset switch 6 is turned on, the power supply from the power source 3 to the driver 2 continues during the waiting time Tn, as in the case in which the stop instruction switch 5 is turned on. After the elapse of the waiting time Tn, the driver power source in the driver 2 is stopped, and the dynamic brake acts on the driver 2 to safely stop the movable body 4. Note that the power supply from the power source 3 to the driver 2 is not stopped even after the elapse of the waiting time Tn, unlike the case in which the stop instruction switch 5 is turned on.

In this embodiment, the controller 1 sets the waiting time Tn in accordance with the driving status of the movable body 4. Consequently, the movable body 4 can be stopped more moderately and safely than in the prior art in accordance with its operation status. This makes it possible to suppress, for example, a drift of a linear motor movable element and to minimize the adverse influence of the stopping of the movable body 4 on, for example, a substrate on a stage.

In this embodiment, if an abnormality is detected in the power supply of the power source 3, the controller 1 activates the dynamic brake without waiting for the waiting time Tn to stop the movable body 4.

Although the above description has been given assuming that only one movable body 4 is present, the present invention can be applied even when a plurality of movable bodies 4 are present.

Embodiment of Exposure Apparatus

Figure 3:
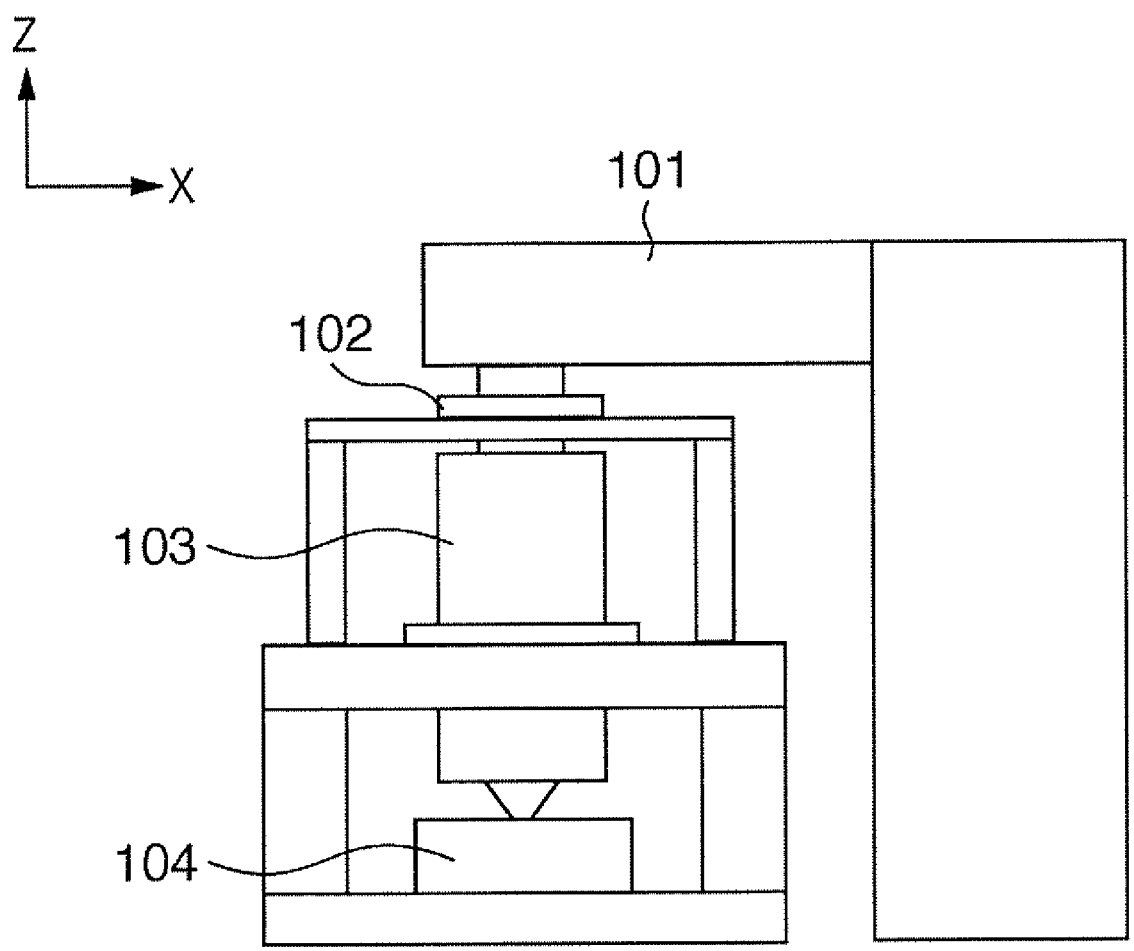
FIG. 3 is a view for explaining an exposure apparatus.

An exemplary exposure apparatus to which the positioning apparatus according to the present invention is applied will now be described. As shown in FIG. 3, the exposure apparatus has an illumination device 101, an original stage 102 which carries an original, a projection optical system 103, and a substrate stage 104 which carries a substrate. At least one of the original stage 102 and the substrate stage 104 is positioned by the above-described positioning apparatus. The exposure apparatus projects and transfers by exposure a circuit pattern formed on the original onto a substrate, and may be of the step & repeat projection exposure type or the step & scan projection exposure type.

The illumination device 101 illuminates a reticle on which a circuit pattern is formed, and has a light source unit and illumination optical system. The light source unit uses, for example, a laser as a light source. The laser can be, for example, an ArF excimer laser with a wavelength of about 193 nm, a KrF excimer laser with a wavelength of about 248 nm, or an $F_2$ excimer laser with a wavelength of about 153 nm. However, the type of laser is not particularly limited to an excimer laser and may be, for example, a YAG laser, and the number of lasers is not particularly limited either. When a laser is used as the light source, an optical system for shaping a parallel light beam from the laser beam source into a desired beam shape, and an optical system for converting a coherent laser beam into an incoherent one are preferably used. Also, the light source which can be used for the light source unit is not particularly limited to a laser, and one or a plurality of mercury lamps or xenon lamps can be used.

The illumination optical system illuminates a mask and includes, for example, a lens, mirror, light integrator, and stop. The projection optical system 103 can be, for example, an optical system having a plurality of lens elements alone, an optical system having a plurality of lens elements and at least one concave mirror, an optical system having a plurality of lens elements and at least a diffractive optical element, or an optical system having only mirrors.

The original stage 102 and substrate stage 104 can move by, for example, a linear motor. In the step & scan projection exposure scheme, the stages 102 and 104 move synchronously. An actuator is separately provided to at least one of the substrate stage 104 and the original stage 102 to align the original pattern onto the substrate.

The above-described exposure apparatus can be used to manufacture micropatterned devices, for example, a semiconductor device such as a semiconductor integrated circuit, a micromachine, and a thin-film magnetic head.

A method of manufacturing a device using the above-described exposure apparatus will be exemplified next.

Devices (e.g., a semiconductor integrated circuit device and liquid crystal display device) are manufactured by a step of exposing a substrate having a photosensitive resist layer deposited thereon to radiant energy using the exposure apparatus according to the above-described embodiment, a step of developing the resist exposed in the exposing step, and other known steps (e.g., etching, resist removing, dicing, bonding, and packaging steps) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-205848, filed Aug. 7, 2007, which is hereby incorporated by reference herein in its entirety.

What is claimed is:

1. An apparatus comprising:
a movable body including a stage;
a driver configured to drive the movable body;
a power source configured to supply power to the driver;
a sensor configured to detect a driving status of the movable body driven by the driver, said driving status comprising one or more of a position, a velocity and an acceleration of the movable body; and
a controller configured to stop the power supply from the power source to the driver, after a time period elapses in response to a received stop instruction signal to stop the driving of the movable body;
wherein the time period is determined by the controller in accordance with the driving status detected by the sensor.

2. The apparatus according to claim 1, wherein the stop instruction signal is transmitted in accordance with the operation of a switch configured to instruct to stop the driver.

3. The apparatus according to claim 1, wherein the driver includes a dynamic brake, and the controller activates the dynamic brake in response to detection of an abnormality in the power being supplied by the power source, wherein the controller determines the time period at which the dynamic brake can safely stop the movable body based on the driving status detected by the sensor.

4. A method of manufacturing a device, the method comprising:
driving the movable body with a drive to a position at which the substrate can be exposed to radiant energy;
exposing a substrate located in a stage of a movable body to radiant energy;
supplying power to the driver with a power supply;
detecting a driving status of the movable body with a sensor as it is driven, said driving status comprising one or more of a position, a velocity and an acceleration of the movable body; and
stopping the power supply from the power source to the driver, after a time period elapses in response to a received stop instruction signal;
determining the time period with a controller in accordance with the driving status detected by the sensor;
developing the exposed substrate; and
processing the developed substrate to manufacture the device.

5. The apparatus of claim 1, wherein the stage is an original stage configured to hold an original or a substrate stage configured to hold a substrate.

6. The apparatus of claim 5, further comprising a projection optical system that exposes the original held on the original stage or the substrate held on the substrate stage.

7. The apparatus of claim 1, the controller configured to stop the power supply from the power source to the driver, after a time period elapses that is sufficient to safely stop the movable body, in response to a received stop instruction signal to stop the driving of the movable body.

8. The method of claim 4, the controller configured to stop the power supply from the power source to the driver, after a time period elapses that is sufficient to safely stop the movable body, in response to a received stop instruction signal to stop the driving of the movable body.

9. An exposure apparatus for projecting a pattern image of an original onto a substrate, the exposure apparatus comprising a projection optical system, a positioning apparatus operable to position a movable body, including at least one of: an original stage configured to hold an original; and a substrate stage configured to hold a substrate, the positioning apparatus comprising:
a movable body including a stage;
a driver configured to drive the movable body;
a power source configured to supply power to the driver;
a sensor configured to detect a driving status of the movable body driven by the driver, said driving status comprising one or more of a position, a velocity and an acceleration of the movable body; and
a controller configured to stop the power supply from the power source to the driver, after a time period elapses in response to a received stop instruction signal to stop the driving of the movable body;
wherein the time period is determined by the controller in accordance with the driving status detected by the sensor.

10. The apparatus of claim 1, the controller configured to stop the power supply from the power source to the driver, after a time period elapses that is sufficient to safely stop the movable body, in response to a received stop instruction signal to stop the driving of the movable body.

11. The exposure apparatus according to claim 9, wherein the stop instruction signal is transmitted in accordance with the operation of a switch configured to instruct to stop said driver.

12. The exposure apparatus according to claim 9, wherein said driver includes a dynamic brake, and
wherein said controller activates said dynamic brake in response to detection of an abnormality in the power being supplied by said power source.

* * * * *